(12) United States Patent
Baruch et al.

(10) Patent No.: US 8,030,953 B2
(45) Date of Patent: Oct. 4, 2011

(54) DEVICE AND METHOD FOR TESTING INTEGRATED CIRCUITS

(75) Inventors: Ezra Baruch, Karkur (IL); Michael Priel, Hertzelia (IL); Dan Kuzmin, Givat Shmuel (IL)

(73) Assignee: Freescale Semiconductor, Inc., Austin, TX (US)

( * ) Notice: Subject to any disclaimer, the term of this patent is extended or adjusted under 35 U.S.C. 154(b) by 183 days.

(21) Appl. No.: 12/301,554

(22) PCT Filed: May 29, 2006

(86) PCT No.: PCT/IB2006/051700
§ 371 (c)(1),
(2), (4) Date: Nov. 19, 2008

(87) PCT Pub. No.: WO2007/138387
PCT Pub. Date: Dec. 6, 2007

(65) Prior Publication Data
US 2009/0195265 A1  Aug. 6, 2009

(51) Int. Cl.
*G01R 31/28* (2006.01)
(52) U.S. Cl. .............................. 324/750.03; 324/762.01

(58) Field of Classification Search .................. None
See application file for complete search history.

(56) References Cited

U.S. PATENT DOCUMENTS

| 4,244,048 | A | * | 1/1981 | Tsui .............................. 714/726 |
| 5,016,220 | A | * | 5/1991 | Yamagata ..................... 365/201 |
| 2002/0190742 | A1 | | 12/2002 | Ooishi |
| 2004/0051574 | A1 | | 3/2004 | Ko et al. |
| 2004/0181724 | A1 | | 9/2004 | McBride |

OTHER PUBLICATIONS

International Search Report correlating to PCT/IB2006/051700, WO 2007/138387 A1, dated Feb. 14, 2007.

* cited by examiner

*Primary Examiner* — Paresh Patel

(57) ABSTRACT

A method and device for testing an integrated circuit. The method includes selecting between a shadow latch data retention mode and a shadow latch test mode; performing a first test of an integrated circuit; storing, at the shadow latch if the shadow latch test mode is selected, information representative of a first test-imposed state; performing a second test of the integrated circuit; and generating a test equipment detectable signal if the first test-imposed state differs from a second test-imposed state of the tested latch.

20 Claims, 5 Drawing Sheets

US 8,030,953 B2

DEVICE AND METHOD FOR TESTING INTEGRATED CIRCUITS

FIELD OF THE INVENTION

The present invention relates to devices and methods for testing integrated circuits.

BACKGROUND OF THE INVENTION

Integrated circuits are required to operate over a large range of operational parameters, wherein operational parameters include, for example, temperature, humidity, power supply level and clock signal frequency. Many integrated circuits can properly operate at a certain combination of temperature, humidity, power supply level and frequency while fail at other combinations within the expected range of operational parameters.

Once a tested integrated circuit fails there is still a need to determine why it failed. This can involve determining which circuitry of the integrated circuit failed. Due to the complexity and size of modern integrated circuits this determination stage can be time consuming and very complicated. Typically, the analysis is based upon extensive knowledge of the design of the integrated circuit, the manner in which it has to operate and the like.

One prior art failure analysis method is known as latch divergence. Latch divergence uses a very long chain of latches within the integrated circuit. Data from this very long chain of latches is scanned out and compared to expected data values. This comparison can indicate which portion of the integrated circuit failed.

There is a need to provide efficient methods and devices for testing integrated circuits.

SUMMARY OF THE PRESENT INVENTION

A device and a method for testing integrated circuits, as described in the accompanying claims.

BRIEF DESCRIPTION OF THE DRAWINGS

The present invention will be understood and appreciated more fully from the following detailed description taken in conjunction with the drawings in which.

DETAILED DESCRIPTION OF PREFERRED EMBODIMENTS

Embodiments of the present invention illustrated in the accompanying drawings provide an integrated circuit and a testing method that use data retention circuits to store the status of a tested latch during a certain test and a comparator that compares a stored status of the tested latch to a current status of the latch and to selectively generate a test equipment detectable signal.

A data retention circuit includes a shadow latch. The shadow latch can be implemented by two inverters, can form a part of a flip-flop but can also be implemented by memory cells of a memory unit such as but not limited a RAM memory unit and the like.

Conveniently, various testing methods can be applied to detect the test equipment detectable signal and to indicate possible failures. These testing method can include, for example, photon emission, laser-based probing and the like.

Conveniently, the data retention circuit can include any prior art circuit such as the circuits illustrated in the following patents and patent applications, all being incorporated herein by reference: U.S patent application publication number 2004/0051574 of Ko et al; PCT patent application publication number WO 2004/021351A1 of Garg et al; U.S. Pat. No. 5,600,588 of Kawashima; U.S. patent application 2004/0227542 of Bhavnagarwala et al. and U.S. Pat. No. 6,755,180 of Biyani et al.

Conveniently, the data retention circuit can have the format illustrated in the accompanying drawings.

It is further noted that all the drawings are out of scale.

Conveniently a method is provided. The method includes: performing a first test of an integrated circuit; storing, at a shadow latch adapted to operate at a shadow latch data retention mode or at a shadow latch test mode, information representative of a first test-imposed state; performing a second test of the integrated circuit; and generating a test equipment detectable signal if the first test-imposed state differs from a second test-imposed state of the tested latch.

Conveniently, the stage of generating is followed by detecting the test equipment detectable signal.

Conveniently, the stage of performing of the second test is preceded by altering at least one operational parameter.

Conveniently, the method includes storing information representative of a pre-deactivation state of a tested latch while the tested latch is deactivated; and sending to the tested latch (directly or via a comparator connected to the tested latch) the information representative of the pre-deactivation state of the tested latch when the tested latch is reactivated.

Figure 1:
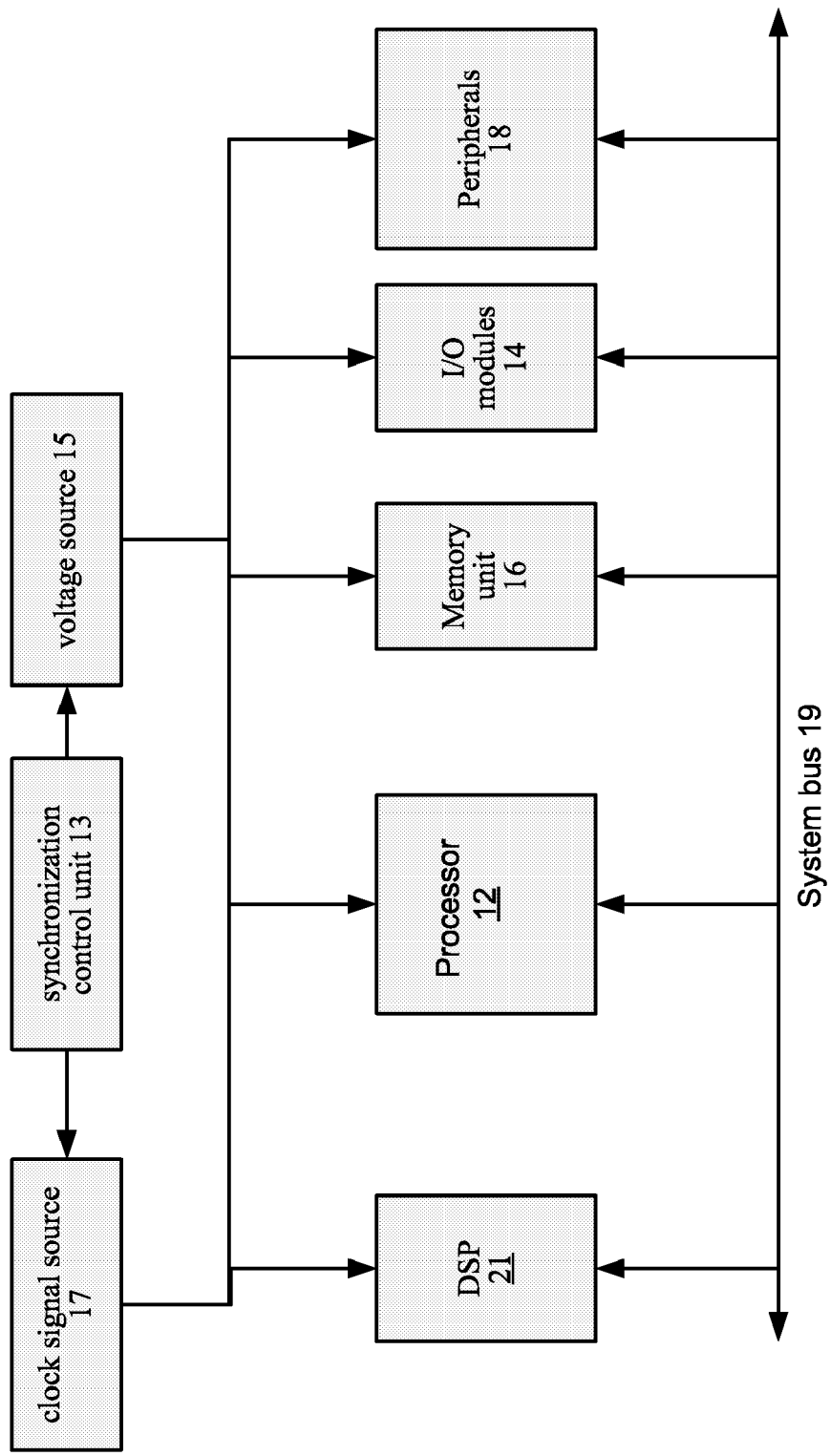
FIG. 1 illustrates an integrated circuit, according to an embodiment of the invention.

FIG. 1 is a schematic illustration of an integrated circuit 10 that includes various devices. Each device may include a large number of power reduction circuitries, according to an embodiment of the invention.

Integrated circuit 10 includes various units such as but not limited to general purpose processor 12, I/O module 14, memory unit 16, peripheral 18, and digital signal processor (DSP) 21. These units are linked to each other by various lines and buses and receive clock signals and power supply from one or more sources, such as clock signal source 17 and voltage source 15. It is noted that integrated circuit 10 can include other units, that some of these unit are optional and that integrated circuit 10 can include multiple units of the same kind.

Optionally, the clock signal source 11 and the voltage source 15 are also connected to a synchronization control unit 13 that matches between the clock frequency and supplied voltages, such as to prevent a case in which the voltage supplied to one or more units is too low to support the clock frequency of the clock signal. This matching is useful when altering the operational mode of the integrated circuit and applying Differential Voltage Frequency Scaling (DVFS) techniques. It is noted that this configuration is optional and that integrated circuit 10 does not necessarily apply DVFS techniques.

Typically, integrated circuit 10 includes multiple busses and lines and the various units of integrated circuit 10 can be connected to the same bus, but this is not necessarily so. For convenience of explanation FIG. 1 illustrates a device bus that is shared by units 12, 14, 16, 18 and 21.

It is noted that integrated circuit 10 can have various configurations and that the units illustrated in FIG. 1 represent only a single exemplary configuration of a device that applies the power reduction technique. Typically, integrated circuit 10 is included within a mobile device such as a cellular phone, a music player, a video player, a personal data accessory, and the like.

Modern cores such as processor 12 and DSP 21 can include millions of transistors. Integrated circuit 10, or at least some of its units (such as but not limited to processor 12 and DSP 21) can operate in various operational modes, including low power modes such as but not limited to an idle (also being referred to a shut down or standby) mode. During an idle mode it is desired to reduce the power consumption of a device, especially in view of the low computational load imposed on said device during the idle mode.

It is noted that although the following figures illustrate a first (normal) power supply such as VDD 162 as well as a second (retention) power supply VRET164 that multiple power supplies can be used for powering different regions of the device. For example, the integrated circuit 10 can include multiple voltage/frequency regions. Each voltage/frequency region can be powered by its own power supply. Accordingly, different retention latches (latches that belong to a second group of latches) can receive different retention power signals.

Typically, once integrated circuit 10, or one of its units (it is assumed for convenience of explanation that processor 12 makes this decision) decides to enter an idle mode. Once this decision is made the retention power supply is asserted and after a short period (required for storing data at the retaining latches) the normal power supply is negated. This idle mode ends by asserting the normal power supply and after a short period (required for restoring the data to the normal latches) the retention power supply is negated.

Integrated circuit 10 is usually expected to operate at a large range of operational parameters. During failure analysis the integrated circuit 10 is tested while imposing different operational parameters. Testing an integrated circuit under different operational parameters is known in the art. The ambient temperature can be changed by the test equipment, while the power supply level and/or clock frequency can be altered by the test equipment or by sending commands to the clock signal source 17, voltage source 15 and/or to the synchronization control unit 13.

Typically, if integrated circuit 10 fails in one test and succeeds in another test, which is executed under different operational parameters, the status of tested latches within the integrated circuit during the failed test and during the successful test can be compared to provide an indication of why the integrated circuit failed in a certain test.

It is noted that the integrated circuit 11 can be tested multiple times, until it first fails and then a comparison between the states of one or more tested latches is made.

It is further notes that in many cases the number of tested latches is large and even very large. These tested latches usually include information that reflects the state of the integrated circuit 11. More complex integrated circuits usually have more tested latches. A tested latch is a latch that is part of the functional portion of the integrated circuit and can be selectively connected to a shadow latch. The shadow latch can be used for storing information representative of a state of the tested latch during a test, but also functions as a data retention latch during low power or shut down modes of the tested latch.

For simplicity of explanation the following drawings illustrated a single tested latch and a single shadow latch.

Figure 2:
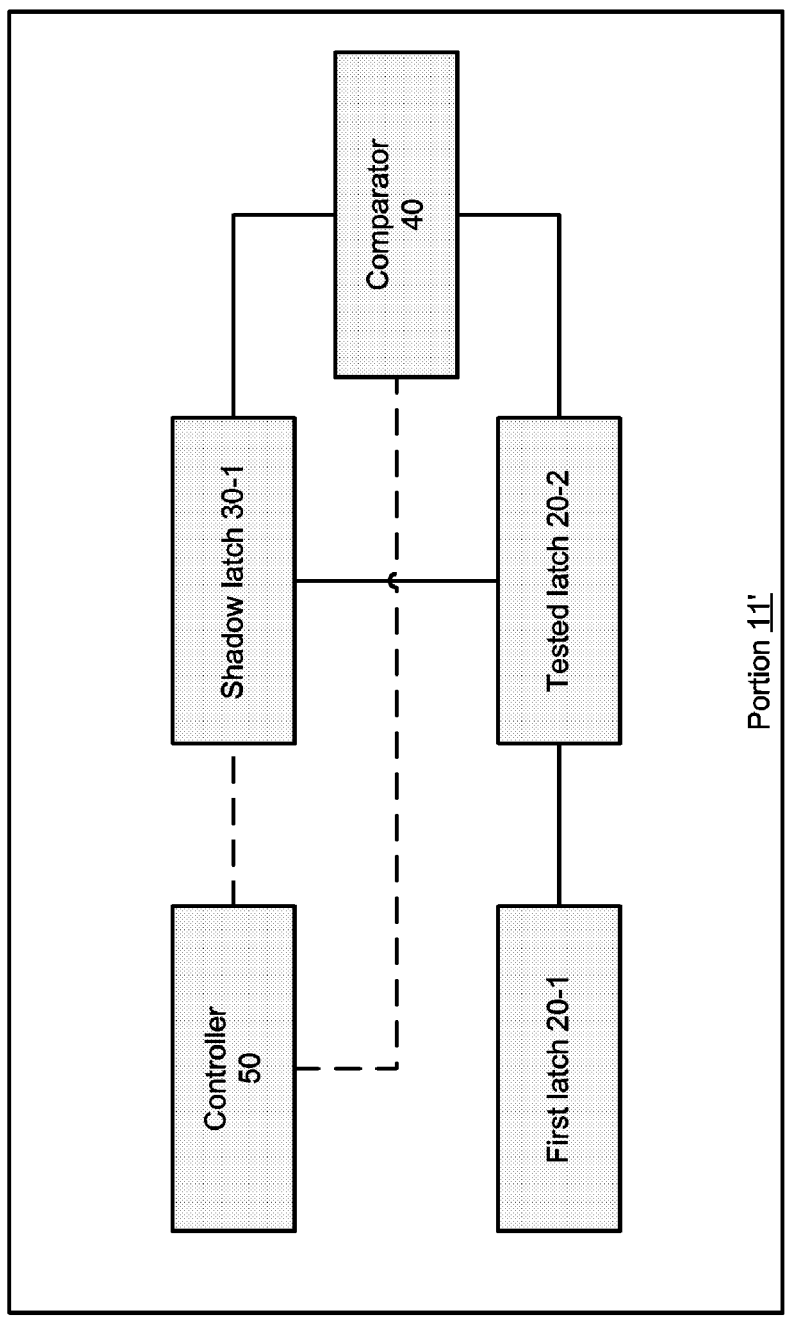
FIG. 2 illustrates a portion of an integrated circuit, according to an embodiment of the invention.

FIG. 2 illustrates a portion 11' of integrated circuit 11, according to an embodiment of the invention.

Portion 11' includes controller 50, shadow latch 30-1, first latch 20-1, tested latch 20-2 and comparator 40.

Figure 3:
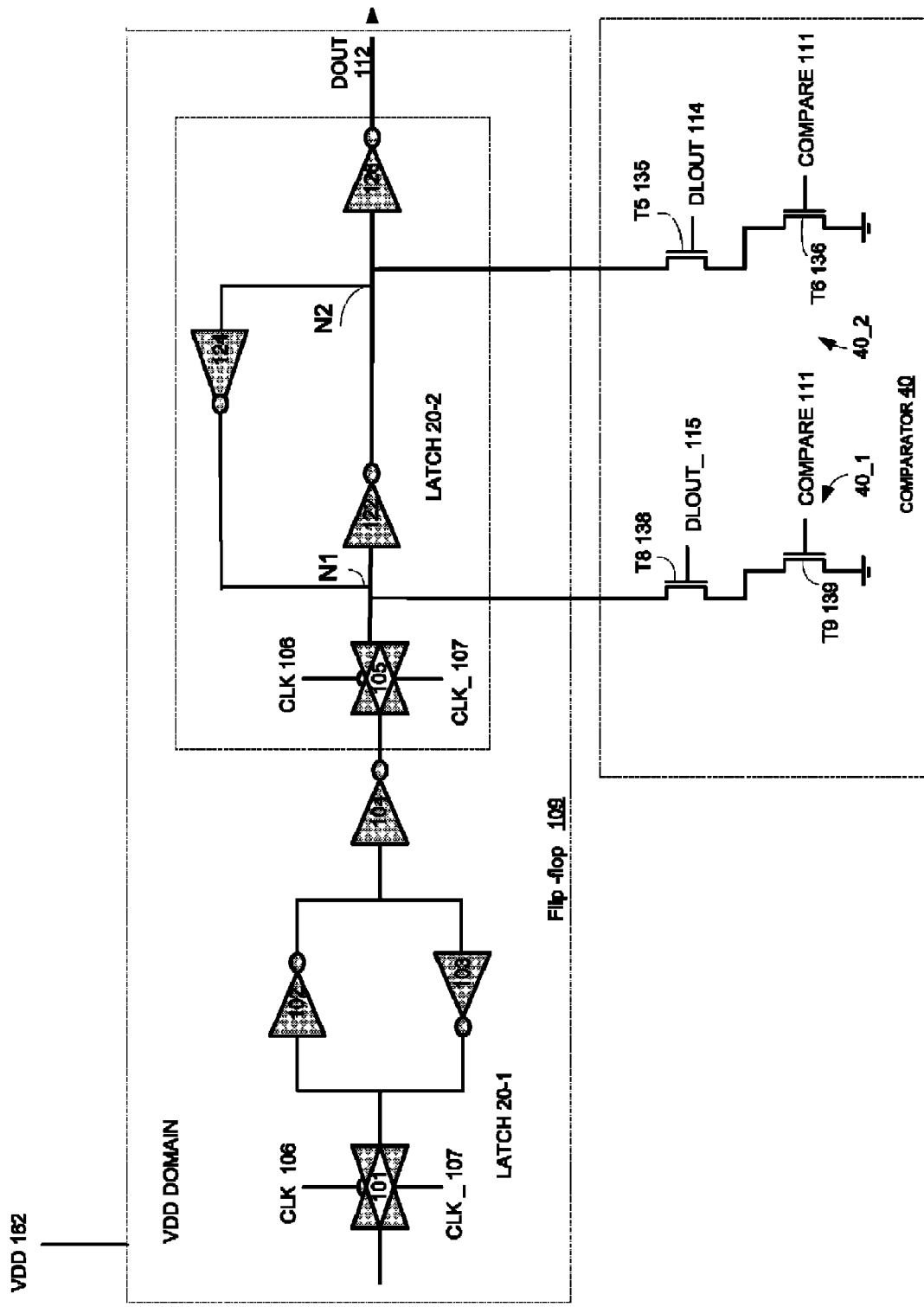
FIG. 3 illustrates a flip-flop and a comparator according to an embodiment of the invention.

First latch 20-1 and tested latch 20-2 are serially connected to each other to form a flip-flop such as flip-flop 109 of FIG. 3.

Controller 50 controls comparator 40 and shadow latch 30-1 and especially controls when comparator 40 performs a comparison and when shadow latch 30-1 stores information or provided information.

Shadow latch 30-1 is adapted to store information representative of a pre-deactivation state of tested latch 20-2 while tested latch 20-2 is deactivated, and to store information representative of a first test-imposed state of tested latch 20-2 while tested latch 20-2 is tested by a second test. In other words, shadow latch 30-1 can operate at a shadow latch data retention mode and/or at a shadow latch test mode.

Comparator 40 is adapted to generate a test equipment detectable signal if the first test-imposed state differs from a second test-imposed state of tested latch 20-2.

Shadow latch 30-1 can be positioned close to tested latch 20-2, away from tested latch 20-2, in a different region than tested latch 20-2 and the like.

Latches 20-1 and 20-2 are powered by normal power supply VDD 162. Shadow latch 30-1 is powered by retention power supply VRET 164. FIG. 3 illustrates flip-flop 109 and comparator 40 according to an embodiment of the invention. It is noted that COMPARE 111 can be used for comparisons (for example between test induced states) while power (VDD) is on and also for write back (recovery) operations during power up (after tested latch 20-2 exits a low power mode).

First latch 20-1 includes a first transfer gate 101, two inversely connected inverters 102 and 103, and a third inverter 104.

An input node of first transfer gate 101 forms the input node of flip-flop 109. The output of the first transfer gate 101 is connected to an input of inverter 102 and to an output of inverter 103. The input of inverter 103 is connected to the output of inverter 102 and to an input mode of third inverter 104.

Tested latch 20-2 includes a second transfer gate 105, two inversely connected inverters 124 and 126 and sixth inverter 126.

An input node of second transfer gate 105 is connected to an output of third inverter 104. The output of transfer gate 105 is connected (at first node N1) to an input of inverter 122 and to an output of inverter 124. The input of inverter 124 is connected (at second node N2) to the output of inverter 122 and to an input mode of sixth inverter 126. Sixth inverter 126 output is the output signal DOUT 112. The complementary signal of DOUT 112 is denoted DOUT_ 113.

First node N1 is connected to first branch 40-1 of comparator 40. First branch 40-1 includes transistor T8 138 and transistor T9 139. Transistor T9 139 is connected between transistor T8 138 to the ground.

Second node N2 is connected to second branch 40-2 of comparator 40. Second branch 40-2 includes transistors T5 135 and transistor T6 136. Transistor T6 136 is connected and T5 135 to the ground.

The gates of transistors T9 139 and T6 136 receive signal COMPARE 111 at their gates. Assuming that transistors T6 136 and T9 139 are NMOS transistors, transistors T9 and T6 are deactivated ("off") if COMPARE 111 is low. This disconnects transistors T5 and T8 from the ground. If COMPARE 111 is high transistors T5 and T8 are grounded.

The gate of transistor T5 receives, from shadow latch 30-1, signal DLOUT_ 115 while the gate of transistor T8 receives, from shadow latch 30-1, a complementary signal DLOUT 114. Thus, assuming that the comparator 40 is activated (COMPARE 111 is high) one of the branches is active. The active branch is determined by the values of DLOUT_ 114 and DLOUT 115.

DLOUT_ 114 and DLOUT 115 represent the data stored in shadow latch 30-1. This data reflects the state of a first test-imposed state.

First branch 40-1 will perform a comparison when DLOUT_ 115 is high while second branch 40-2 will perform a comparison when DLOUT 114 is high. If DLOUT_ 115 is high and DOUT 112 is high then a contention current will flow through first branch 40-1. If DLOUT 114 is high and DOUT_ 113 is high then a contention current will flow through second branch 40-2.

It is noted that during a power up sequence transistor T8 138 or T5 135 will create enough asymmetry for powering up of tested latch 20-2 to the required state.

Figure 4:
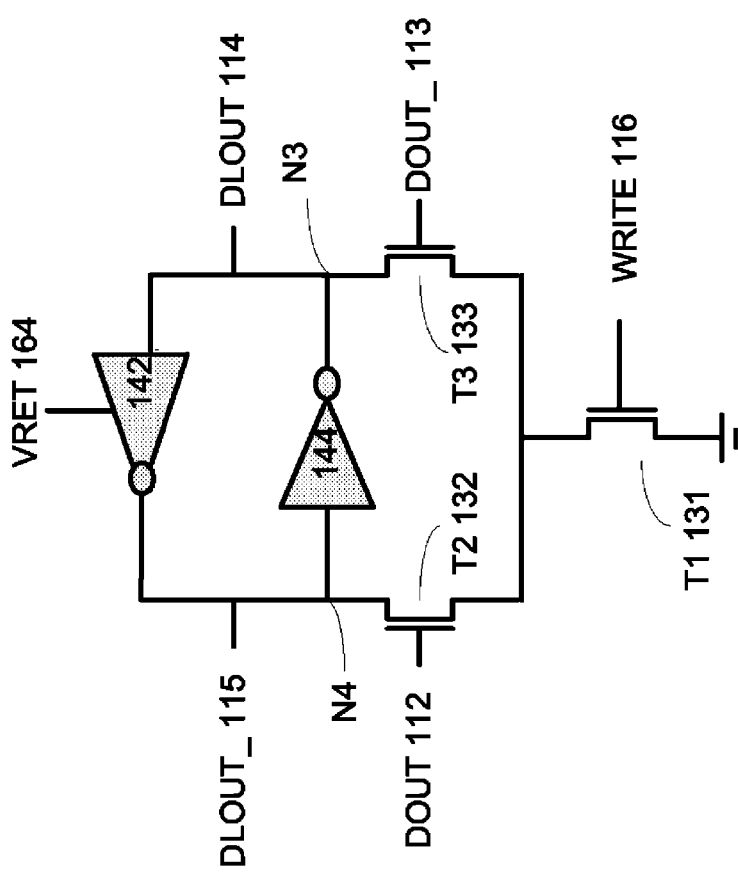
FIG. 4 illustrates a shadow latch according to an embodiment of the invention.

FIG. 4 illustrates a shadow latch 30-1 according to an embodiment of the invention.

Shadow latch 30-1 includes transistors T1-T3 131-133, and inverters 142 and 144.

An input of inverter 144 is connected (at node N3) and to an output of inverter 142. The input of inverter 142 is connected (at node N4) to the output of inverter 144. Node N3 is also connected to the source of transistor T3 133 and node N4 is also connected to the source of transistor T2 132.

The drains of transistors T1 131 and T2 143 are connected to the source of transistor T1 131. The drain of transistor T1 131 is grounded. The gate of transistor T1 131 receives signal WRITE 116 that is asserted when there is a need to write information to shadow latch 30-1. This information reflects a state of tested latch 20-2. The gate of transistor T2 132 receives DOUT 112 while the gate of transistor T3 133 receives signal DOUT_ 113. If transistor T1 131 is active then the values of DOUT 112 and DOUT_ 113 determine the state of inverters 142 and 144.

Node N3 provides signal DLOUT 114 while node N4 provides signal DLOUT_ 115. These signals reflect the state of a tested latch when a previous write process to shadow latch 30-1 occurred. Signals DLOUT 114 and DLOUT_ 115 are sent to comparator 40 that compares these signals to the voltage at nodes N1 and N2.

Figure 5:
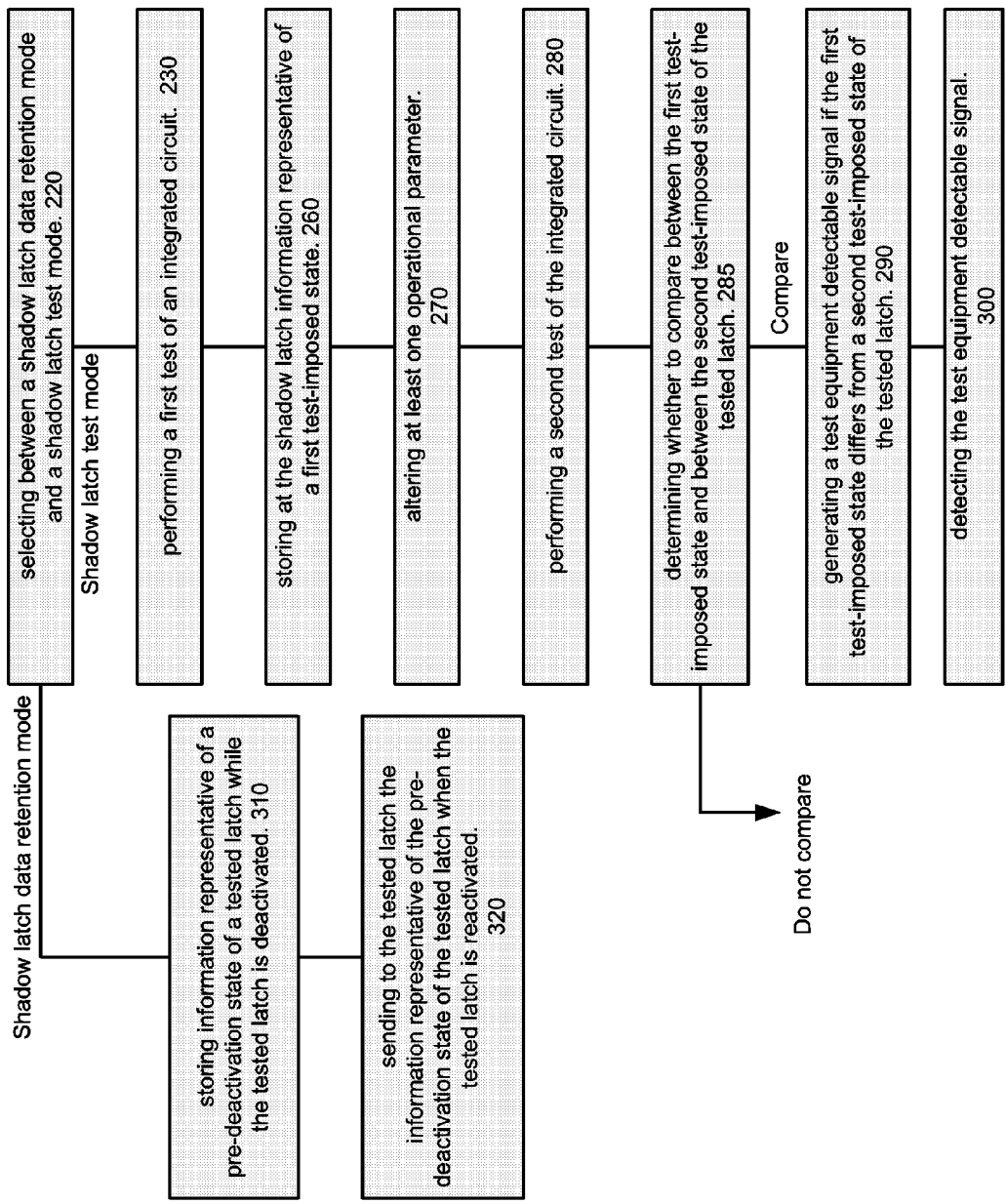
FIG. 5 is a flow chart of a method according to an embodiment of the invention.

FIG. 5 is a flow chart of method 200 according to an embodiment of the invention.

Method 200 starts by stage 220 of selecting between a shadow latch data retention mode and a shadow latch test mode. During the shadow latch data retention mode a shadow latch operates as a data retention circuit. It stores information representative of a state of another latch (such as a tested latch) while the tested latch is deactivated. Usually, the deactivation reduces the power consumption of an integrated circuit that includes the shadow latch and the tested latch. During a shadow latch test mode the shadow latch stores information representative of the state of the tested latch during a previous test.

It is noted that the selection may involve selecting to operate the shadow latch at a first mode during a certain time period and then selecting to operate the shadow latch at another mode during another time period. It is further noted that the shadow latch can store information representative of a first test-imposed state of the tested latch during a deactivation of the tested latch.

Conveniently, if the integrated circuit is being tested the shadow latch test mode is selected. The shadow latch data retention mode can be selected after or before the test period.

If a shadow latch test mode is selected then stage 220 is followed by stage 230 of performing a first test of an integrated circuit.

Stage 230 is followed by stage 260 of storing at the shadow latch information representative of a first test-imposed state. The first test-imposed state is the state of the tested latch during the first test or during a portion of the first test. It is usually the state of the tested latch at the end of the first test.

Stage 260 is followed by stage 270 of altering at least one operational parameter. This may include altering an ambient temperature, a frequency or a voltage level of a combination thereof, or other operational parameters.

Stage 270 is followed by stage 280 of performing a second test of the integrated circuit.

Stage 280 can be followed by stage 285 of determining whether to compare between the first test-imposed state and between the second test-imposed state of the tested latch.

Conveniently, the determination is responsive to results of the first test and of the second test. For example, if the integrated circuit failed in one test and succeeded in the other a comparison should be made. Else, the method can continue to perform another test and the results of that test are not necessarily stored.

The second test-imposed state is the state of the tested latch during the second test or during a portion of the second test. It is usually the state of the tested latch at the end of the second test.

Stage 285 is followed by stage 290 if it is determined that a comparison should be made. Stage 290 includes generating a test equipment detectable signal if the first test-imposed state differs from a second test-imposed state of the tested latch. This signal can be current or other signal that can be easily detected by a test equipment such as an infra-red based equipment or a laser based equipment that are able to detect photon or heat generated by a current, or cause a detectable change in the current that is generated by a comparator.

Stage 290 is followed by stage 300 of detecting the test equipment detectable signal.

If during stage 220 a shadow latch data retention mode is selected then stage 220 is followed by stage 310 of storing information representative of a pre-deactivation state of a tested latch while the tested latch is deactivated.

The pre-deactivation state is the state of the tested latch before it is deactivated.

Stage 310 is followed by stage 320 of sending to the tested latch the information representative of the pre-deactivation state of the tested latch when the tested latch is reactivated.

Conveniently, stage 320 includes sending (320) to a comparator connected to the tested latch the information representative of the pre-deactivation state of the tested latch when the tested latch is reactivated, and affecting a state of the tested latch in response to the information sent to the comparator.

Variations, modifications, and other implementations of what is described herein will occur to those of ordinary skill in the art without departing from the spirit and the scope of the invention as claimed. Accordingly, the invention is to be defined not by the preceding illustrative description but instead by the spirit and scope of the following claims.

We claim:

1. An integrated circuit comprising:
   a tested latch;
   a comparator; and
   a shadow latch wherein the shadow latch is adapted to;

(i) store information representative of a pre-deactivation state of the tested latch while the tested latch is deactivated; and (ii) store information representative of a first test-imposed state of the tested latch while the tested latch is tested by a second test; and wherein the comparator is adapted to generate a test equipment detectable signal if the first test-imposed state differs from a second test-imposed state of the tested latch.

2. The integrated circuit according to claim 1 wherein the test equipment detectable signal is current.

3. The integrated circuit according to claim 2 wherein the shadow latch is adapted to send to the tested latch the information representative of the pre-deactivation state of the tested latch when the tested latch is reactivated.

4. The integrated circuit according to claim 1 wherein the shadow latch is adapted to send to the tested latch the information representative of the pre-deactivation state of the tested latch when the tested latch is reactivated.

5. The integrated circuit according to claim 4 wherein the shadow latch comprises two inversely coupled inverters, a first transistor switch and at least one additional transistor adapted to selectively couple an inverter out of the two inversely coupled invertors to a ground.

6. The integrated circuit according to any claim 1 wherein the shadow latch is adapted to send to the comparator the information representative of the pre-deactivation state of the tested latch when the tested latch is reactivated and the comparator affects a state of the tested latch in response to the information.

7. The integrated circuit according to claim 1 wherein the comparator comprises a pull down circuit.

8. The integrated circuit according to claim 1 wherein the shadow latch comprises two inversely coupled inverters, a first transistor switch and at least one additional transistor adapted to selectively couple an inverter out of the two inversely coupled invertors to a ground.

9. A method for testing an integrated circuit, the method comprises:
performing a first test of the integrated circuit;
selecting between a shadow latch data retention mode and a shadow latch test mode;
storing, at a shadow latch if the shadow latch test mode is selected, information representative of a first test-imposed state of a tested latch of the integrated circuit;
performing a second test of the integrated circuit; and
generating a test equipment detectable signal if the first test-imposed state differs from a second test-imposed state of the tested latch.

10. The method according to claim 9 further comprising:
storing, if the shadow latch data retention mode is selected, information representative of a pre-deactivation state of the tested latch while the tested latch is deactivated; and
sending to the tested latch the information representative of the pre-deactivation state of the tested latch when the tested latch is reactivated.

11. The method according to claim 10 wherein the generating is followed by detecting the test equipment detectable signal.

12. The method according to claim 9 further comprising:
storing, if the shadow latch data retention mode is selected, information representative of a pre-deactivation state of the tested latch while the tested latch is deactivated; and
sending to a comparator coupled to the tested latch the information representative of the pre-deactivation state of the tested latch when the tested latch is reactivated; and
affecting a state of the tested latch in response to the information sent to the comparator.

13. The method according to claim 9 wherein the generating is followed by detecting the test equipment detectable signal.

14. The method according to claim 9 wherein the performing of the second test is preceded by altering at least one operational parameter.

15. The method according to claim 9 wherein the generating is preceded by determining whether to compare the first test-imposed state with the second test-imposed state of the tested latch.

16. The method according to claim 15 wherein the determining is responsive to results of the first test and of the second test.

17. A method for testing an integrated circuit, the method comprises:
performing a first test of the integrated circuit;
storing, at a shadow latch adapted to operate at a shadow latch data retention mode or at a shadow latch test mode, information representative of a first test-imposed state of a tested latch of the integrated circuit;
performing a second test of the integrated circuit; and
generating a test equipment detectable signal if the first test-imposed state differs from a second test-imposed state of the tested latch.

18. The method according to claim 17 wherein the generating is followed by detecting the test equipment detectable signal.

19. The method according to claim 18 further comprising:
storing information representative of a pre-deactivation state of the tested latch while the tested latch is deactivated; and
sending to the tested latch the information representative of the pre-deactivation state of the tested latch when the tested latch is reactivated.

20. The method according to claim 17 wherein the performing of the second test is preceded by altering at least one operational parameter.

* * * * *